United States Patent [19]

Leibowitz

[11] Patent Number: 4,812,792
[45] Date of Patent: Mar. 14, 1989

[54] HIGH-FREQUENCY MULTILAYER PRINTED CIRCUIT BOARD

[75] Inventor: Joseph D. Leibowitz, Culver City, Calif.

[73] Assignee: TRW Inc., Redondo Beach, Calif.

[21] Appl. No.: 44,689

[22] Filed: May 1, 1987

Related U.S. Application Data

[60] Continuation-in-part of Ser. No. 817,327, Jan. 9, 1986, Pat. No. 4,689,110, which is a division of Ser. No. 564,952, Dec. 22, 1983, Pat. No. 4,591,659.

[51] Int. Cl.[4] .......................... H01P 3/08; H05K 3/06
[52] U.S. Cl. .................................... 333/238; 361/387; 361/414; 156/634; 156/901; 427/96
[58] Field of Search ................... 333/238; 174/68.5; 361/387, 414; 427/96; 428/901; 156/634, 901

[56] References Cited

U.S. PATENT DOCUMENTS

| | | | |
|---|---|---|---|
| 4,047,132 | 9/1977 | Krajewski | 333/238 |
| 4,551,746 | 11/1985 | Gilbert et al. | 357/81 X |
| 4,560,962 | 12/1985 | Barrow | 333/238 |
| 4,591,659 | 5/1986 | Leibowitz | 174/68.5 |
| 4,689,110 | 8/1987 | Leibowitz | 174/68.5 |

Primary Examiner—Paul Gensler
Attorney, Agent, or Firm—Noel F. Heal; Sol L. Goldstein

[57] ABSTRACT

A circuit board having multiple layers of a dielectric material, multiple layers of a conductive metal and multiple layers of graphite bonded together to form a composite multilayer printed circuit board having a desired coefficient of expansion and having strip and microstrip transmission lines for electrically connecting very high frequency electronic components mounted on the circuit board. The multiple layers of graphite are positioned in a symmetrical manner with respect to the thickness of the circuit board and selected in number to provide the circuit board with a desired coefficient of expansion. In addition, at least some of the layers of graphite are positioned in close proximity to some of the layers of conductive metal to provide enhanced thermal conduction from the mounted components.

18 Claims, 2 Drawing Sheets

HIGH-FREQUENCY MULTILAYER PRINTED CIRCUIT BOARD

This application is a continuation-in-part of a copending application by the same inventor entitled "Method of Fabricating Multilayer Printed Circuit Board Structure," having Ser. No. 817,327 and a filing date of Jan. 9, 1896. This copending application issued as U.S. Pat. No. 4,689,110 on Aug. 25, 1987 and is, in turn, a divisional application of an application by the same inventor entitled "Multilayer Printed Circuit Board Structure," having Ser. No. 564,952 and a filing date of Dec. 22, 1983. The parent application issued as U.S. Pat. No. 4,591,659 on May 27, 1986.

BACKGROUND OF THE INVENTION

This invention relates generally to multilayer printed circuit boards that are mechanically stable under varying temperature conditions and, more particularly, to mechanicaly-stable multilayer circuit boards that are useful for very high frequency electronics (50–400 MHz).

Multilayer printed circuit boards are generally used for interconnecting large numbers of integrated-circuit (IC) chips. The IC chips are usually hermetically sealed in individual chip carrirrs fabricated from a ceramic material, such as aluminum oxide. Bonded leads are brought out from each IC chip to the edges of the chip carrier, and the chip carrier is then soldered, by its leads, directly to the circuit board. The principal advantages of this structure are significantly higher circuit densities, improved speed and impedance characteristics, and substantially reduced packaging costs.

However, a major drawback of using chip carriers is that the coefficient of thermal expansion of aluminum oxide is approximately one-half the coefficient of thermal expansion of the glass/epoxy laminates typically used in the manufacture of circuit boards. When the resulting structure is exposed to any significant range of temperatures, the thermal cycling of the structure can crack soldered joints and render the circuit inoperative. One solution to this problem is to use an intermediate member between the chip carrier and the circuit board. The intermediate member is sometimes referred to as a baby board and the circuit board as a mother board. The intermediate member may also take the form of a hybrid package on which the chip carrier is mounted. Another technique is to use a compliant lead structure between the chip carrier and the circuit board, although this increases the packaging costs and results in excessively long lead lengths. Accordingly, a circuit board should have a coefficient of thermal expansion that closely matches that of the chip carriers mounted on the board.

Another difficulty that has arisen as large numbers of components are mounted on circuit boards is that the heat produced by the components must be dissipated in some manner, whether by conduction through the circuit board or by radiative, convective, or forced-air cooling. Since the principal materials used in circuit boards are insulators, the boards themselves have traditionally played no significant role in dissipating heat from the components that they support.

A third factor in the design of circuit boards is that they should be fabricated from a material with a relatively low dielectric constant, to enhance the board's ability to propagate signals over relatively long distances. Some materials, such as polytetrafluoroethylene (PTFE), have good dielectric properties but an undesirably high coefficient of thermal expansion. Kevlar (trademark of E.I. du Pont de Nemours & Co., Inc.) has a negative coefficient of thermal expansion and may be used to reduce the average coefficient of thermal expansion of a multilayer circuit board. However, Kevlar is a poor thermal conductor and, therefore, does nothing to enhance the thermal conduction properties of the board.

The parent application of this continuation-in-part application discloses a multilayer printed circuit board having low dielectric properties, a low or negative thermal coefficient of thermal expansion, and good thermal conduction properties to enhance heat conduction from the components mounted on the board. However, this multilayer printed circuit board is not suitable for very high frequency electronics. The conventional copper traces that are used to establish connections between the electrical components mounted on this circuit board can slow down very high frequency signals and cause line ringing and crosstalk between the signals. Accordingly, there is a need for a multilayer printed circuit board that not only has low dielectric properties, a low or negative thermal coefficient of thermal expansion, and good thermal conduction properties, but also is compatible with very high frequency electronics. The present invention satisfies this need.

SUMMARY OF THE INVENTION

The present invention resides in a multilayer printed circuit board structure in which multiple layers of a dielectric material, multiple layers of a conductive metal and multiple layers of graphite are bonded together to form a composite multilayer printed circuit board having a desired coefficient of expansion and having strip and microstrip transmission lines for electrically connecting high frequency electronic components mounted on the circuit board.

More specifically, in a presently preferred embodiment of the invention, several of the layers of conductive metal are appropriately patterned as dictated by the design of the IC chips to be mounted on the board. These patterned layers are combined with layers of dielectric material and other layers of conductive metal to form one or more strip and microstrip transmission lines. The patterned layers of conductive metal form the line conductors of the transmission lines and the other layers of conductive metal form the ground planes.

The multiple layers of graphite are positioned in a symmetrical manner with respect to the thickness of the circuit board and selected in number to provide a circuit board having a desired coefficient of expansion. In addition, at least some of the layers of graphite are positioned in close proximity to some of the layers of conductive metal to provide enhanced thermal conduction from the mounted components. The multiple layers of dielectric material are used to provide the necessary dielectric properties of the circuit board.

The layers of dielectric material are preferably fabricated from a polytetrafluoroethylene (PTFE) material and the conductive metal layers are preferably fabricated from copper. The graphite layers are preferably formed from woven sheets of fabric that have been impregnated with a bonding material, such as an epoxy resin. However, in an alternative preferred embodiment of the invention, high modulus carbon fiber material is used in alternating layers of unidirectional fibers. The fibers in each layer are more or less parallel to one another, while the alternate layer fiber directions are arranged to provide stiffness and strength along the major axes of the circuit board.

It will be appreciated from the foregoing that the present invention represents a significant advance in the field of multilayer printed circuit boards. In particular, the invention provides a circuit board having strip and microstrip transmission lines and a coefficient of thermal expansion that is substantially reduced and matched to that of the chip carriers. Moreover, the circuit board has good thermal conductivity properties, excellent mechanical strength, and does not sacrifice dielectric performance. Other aspects and advantages of the invention will become apparent from the following more detailed description, taken in conjunction with the accompanying drawings.

DESCRIPTION OF THE PREFERRED EMBODIMENTS

Figure 1:
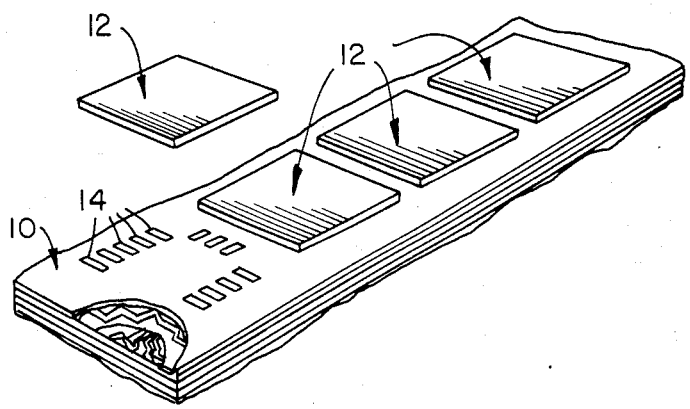
FIG. 1 is a simplified perspective view showing four chip carriers mounted on a multilayer printed circuit board.

As shown in the drawings for purposes of illustration, the present invention is principally involved with multilayer printed circuit boards. There are three desirable properties of circuit boards used to support IC chips packaged in ceramic chip carriers. First, the circuit board should have a relatively low dielectric constant to facilitate transmission of signals over relatively long distances. Second, the coefficient of thermal expansion of the board should be matched to the coefficient of thermal expansion of the chip carriers. Finally, the circuit board should be a good thermal conductor to assist in the dissipation of heat generated by the mounted components. Unfortunately, these three desired characteristics cannot be found in a single circuit board that is also compatible with very high frequency electronic components.

In accordance with the present invention, multiple layers of a dielectric material, multiple layers of a conductive metal and multiple layers of graphite are bonded together to form a composite multilayer printed circuit board having a desired coefficient of expansion and having strip and microstrip transmission lines for electrically connecting high frequency components mounted on the circuit board. FIG. 1 shows a multilayer circuit board 10 made in accordance with the present invention, which is used to support four leadless chip carriers 12, each of which houses an IC chip. Each of the chip carriers 12 has contact pads around the periphery of its bottom face to which input/output leads of the various circuits within the IC chip are connected. The contact pads are soldered to respective contact pads 14 on top of the circuit board 10. Any mismatch between the coefficients of thermal expansion of the chip carriers 12 and the circuit board 10 can result in damage to these electrical connections. Leadless chip carriers are preferred because long lead lengths degrade the high frequency performance of the IC chips.

Figure 2:
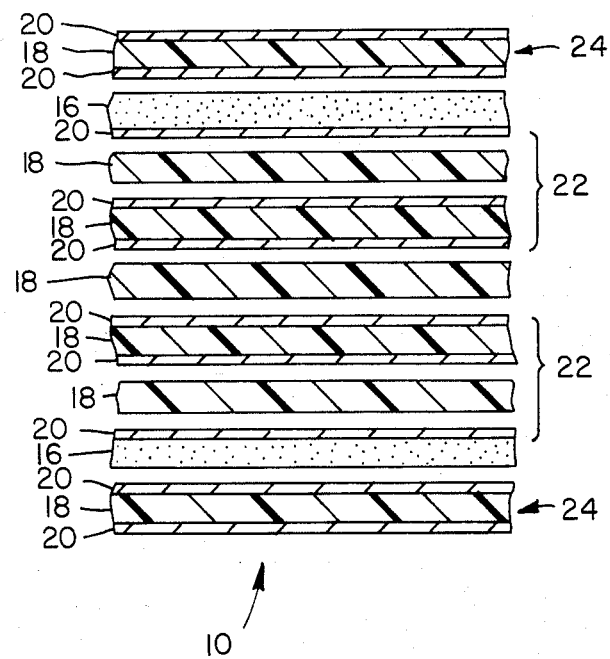
FIG. 2 is a fragmentary sectional view of the various layers that form a multilayer circuit board made in accordance with the present invention.
Figure 3:
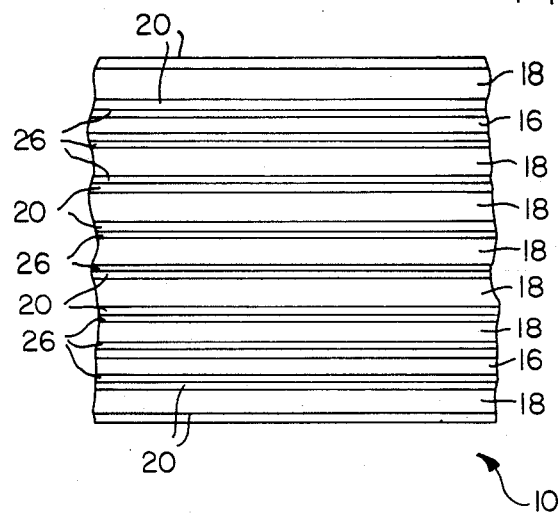
FIG. 3 is a fragmentary sectional view of a multilayer circuit board made in accordance with the present invention.

As shown diagrammatically in FIGS. 2 and 3, the circuit board 10 includes a plurality of layers 16 of graphite interleaved between a plurality of layers 18 of a dielectric material. Some of the layers 16 of graphite are metal-clad layers having one side plated with a conductive metal layer 20, and some of the layers 18 of dielectric material are metal-clad layers having both sides plated with the conductive metal layer 20. One side of several of the metal-clad layers 18 of dielectric material is appropriately patterned as dictated by the design of the IC chips 12 mounted on the circuit board 10.

Figure 4A:
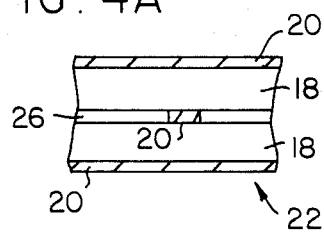
FIG. 4A is a fragmentary, exploded sectional view of a strip transmission line.
Figure 4B:
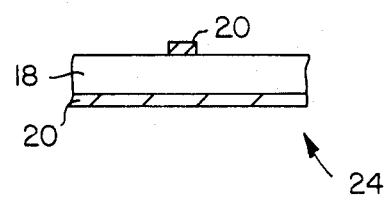
FIG. 4B is a fragmentary, exploded sectional view of a microstrip transmission line.

As shown in FIG. 2, several of the patterned metal-clad layers 18 of dielectric material are each positioned with an unclad layer 18 of dielectric material and a metal-clad layer 16 of graphite to form strip transmission lines 22. The patterned conductive metal layers 20 form the line conductors of the strip transmission lines and the unpatterned conductive metal layers 20 form the ground planes. Several of the patterned metal-clad layers 18 of dielectric material also form microstrip transmission lines 24, which are simply miniaturized versions of the strip transmission lines. The patterned conductive metal layers 20 form the line conductors of the microstrip transmission line 24 and the unpatterned conductive metal layers 20 form the ground planes. The strip 22 and microstrip 24 transmission lines provide high frequency connections between the various chips 12 with transmission characteristics similar to that of coaxial transmission lines. A strip transmission line 22 is shown in FIG. 4A and a microstrip transmission line 24 is shown in FIG. 4. As shown in FIG. 3, the layers are then laminated together with a suitable adhesive 26.

The layers 16 of graphite are positioned in a symmetrical manner with respect to the thickness of the circuit board 10 and selected in number to provide a circuit board 10 having a desired coefficient of expansion. In addition, at least some of the layers 16 of graphite are metal-clad layers, which combine to form the strip 22 and microstrip 24 transmission lines, thereby providing enhanced thermal conduction from the mounted components 12. The multiple layers 18 of dielectric material are used to provide the necessary dielectric properties of the circuit board 10.

The conductive metal layers 20 are preferably fabricated from copper. The layers 18 of dielectric material are preferably fabricated from a polytetrafluoroethylene (PTFE) material, such as CU-CLAD 233, manufactured by the Electronic Products Division of the 3M Company, St. Paul, Minn. 55144. This material is a laminate of PTFE and woven glass and has a low dielectric constant of 2.33, but a relatively high coefficient of thermal expansion. The graphite layers 16 are preferably formed from fibrous carbon material, such as "Thornel" P100 or P75, made by AMOCO Performance Products, 1320 Willow Pass Road, Concord, Calif. 94520. The graphite or carbon yarn is woven into a cloth, which is then impregnated with a bonding material, such as an epoxy resin. In an alternative preferred embodiment, which incorporates high modulus carbon fibers, the carbon fibers are arranged in each layer so that they are more or less parallel to one another and are not woven into cloth, since such weaving may result in damage to the brittle high modulus fibers. Alternate layers are then arranged so that the combination of fiber directions in the layers provides the required rigidity and strength along the major axes of the circuit board. The resin-impregnated graphite cloth cures to a hard, rigid sheet, with practically planar surfaces.

Figure 5:
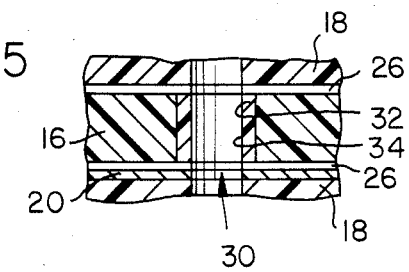
FIG. 5 is a fragmentary sectional view showing how via holes and mounting screw holes are formed in the multilayer circuit board of the present invention.

Hole locations, such as indicated at 30 in FIG. 5, are predetermined, and the layers 16 of graphite are pre-drilled with over-sized holes 32, which are immediately filled with more resin material. Then the layers 16 of graphite are ready to be laminated with the other layers using the adhesive 26. After lamination, holes are made through the entire board 10, but using a smaller diameter drill than the one used to pre-drill the graphite layers 16. Thus, each newly formed hole 34 is surrounded by an annular sheath of insulating material, which serves to electrically insulate the graphite layers 16 from any conductors, such as coaxial transmission lines (not shown), that might be used to connect the various strip 22 and microstrip 24 transmission lines.

The number and thickness of the graphite layers 16 are selected to provide a desired effect on the coefficient of thermal expansion of the circuit board 10. In addition, the graphite layers 16 are disposed in a symmetrical fashion across the thickness of the board 10 to minimize the possibility of bending of the board during temperature changes. The coefficient of thermal expansion of the graphite layers 16 is close to zero after impregnation with epoxy resin. The coefficient of thermal expansion for copper is $9.4 \times 10^{-6}$ in/in/°F., and the coefficient for copper-clad PTFE sheets is much higher. The goal in selecting the number and thickness of the graphite layers 16 is to match the coefficient of thermal expansion to that of the chip carrier material. The most common material, aluminum oxide, has a coefficient of thermal expansion of $3.33 \times 10^{-6}$ in/in/°F.

One of the principal advantages of the use of graphite in the circuit board 10 is that it serves as a good conductor of heat, which normally flows from the mounted components through the copper layers of the board, through mounting bolts, and thence to a housing or other heat sink. In the circuit board of the present invention, the graphite layers 16 provide a parallel path for the flow of heat, and thereby improve the heat dissipation characteristics of the circuit package. Another advantage in using graphite is that it is mechanically strong. The tensile modulus of elasticity for single yarns of the graphite specified above is in the range of 75 to $100 \times 10^6$ psi, but this is naturally reduced when the graphite is impregnated with resin. Nevertheless, the use of graphite greatly strengthens the circuit board structure.

It will be appreciated from the foregoing that the present invention represents a significant advance in the field of multilayer printed circuit boards. In particular, the invention provides a circuit board having strip and microstrip transmission lines and a coefficient of thermal expansion that is substantially reduced and matched to that of the chip carriers. Moreover, the circuit board has good thermal conductivity properties, excellent mechanical strength, and does not sacrifice dielectric performance. Although several preferred embodiments of the invention have been described in detail for purposes of illustration, various modifications may be made without departing from the spirit and scope of the invention. Accordingly, the invention is not to be limited except as by the following claims.

I claim:

1. A high-frequency multilayer printed circuit, comprising:
   a plurality of layers of a conductive metal;
   a plurality of layers of graphite, at least some of which are positioned in close proximity to some of the layers of conductive metal to provide a relatively low resistance path for the flow of heat from the layers of conductive metal; and
   a plurality of layers of a dielectric material;
   wherein the layers are bonded together to form a composite multilayer printed circuit board, the layers of graphite being positioned in a symmetrical manner with respect to the thickness of the circuit board and selected in number to provide a multilayer circuit board having a desired coefficient of thermal expansion;
   and wherein some of the layers of conductive metal are appropriately patterned and combined with other layers of conductive metal and layers of dielectric material to form one or more strip or microstrip transmission lines for electrically connecting very high frequency electronic components mounted on the board.

2. A high-frequency multilayer printed circuit board as set forth in claim 1 wherein the layers of graphite are formed from woven sheets of graphite impregnated with a bonding material.

3. A high-frequency multilayer printed circuit board as set forth in claim 2, wherein the layers of dielectric material include a polytetrafluoroethylene (PTFE) material.

4. A high-frequency multilayer printed circuit board as set forth in claim 1, wherein the layers of graphite are formed from unidirectional fibers of graphite impregnated with a bonding material.

5. A high-frequency multilayer printed circuit board as set forth in claim 4, wherein the layers of dielectric material include a polytetrafluoroethylene (PTFE) material.

6. A high-frequency multilayer printed circuit board, comprising:
   a plurality of metal-clad layers of a dielectric material, each layer having both sides plated with a conductive metal layer;
   plurality of layers of graphite, some of which are metal-clad layers of graphite having one side plated with a conductive metal layer; and
   plurality of unclad layers of a dielectric material;
   wherein the layers are bonded together to form a composite multilayer printed circuit board, the layers of graphite being positioned in a symmetrical manner with respect to the thickness or the circuit board and selected in number to provide a multilayer circuit board having a desired coefficient of thermal expansion;
   and wherein some of the metal-clad layers of dielectric material are appropriately patterned to form microstrip transmission lines for electrically connecting very high frequency electronic components mounted on the board, the patterned conductive metal layers forming the line conductors of the microstrip transmission lines and the unpatterned conductive metal layers forming the ground planes.

7. A high-frequency multilayer printed circuit board as set forth in claim 6, wherein some of the metal-clad layers of dielectric material are appropriately patterned and combined with metal-clad layers of graphite and unclad layers of dielectric material to form strip transmission lines for electrically connecting very high frequency electronic components mounted on the board, the patterned conductive metal layers forming the line conductors of the strip transmission lines and the unpatterned conductive metal layers forming the ground planes.

8. A high-frequency multilayer printed circuit board as set forth in claim 7, wherein the layers of graphite are formed from woven sheets of graphite impregnated with a bonding material.

9. A high-frequency multilayer printed circuit board as set forth in claim 7, wherein the layers of graphite are formed from unidirectional fibers of graphite impregnated with a bonding material.

10. A high-frequency multilayer printed circuit board as set forth in claim 7, wherein the layers of dielectric material include a polytetrafluoroethylene (PTFE) material.

11. A high-frequency multilayer printed circuit board as set forth in claim 7, wherein the conductive metal layers include copper.

12. A method for fabricating a multilayer printed circuit board, comprising the steps of:
   forming a plurality of solid graphite sheets;
   plating one side of some of the solid graphite sheets with a metal conductive layer;
   plating both sides of a plurality of sheets of a dielectric material with a metal conductive layer to form metal-clad sheets of dielectric material;
   etching one side of some of the metal-clad sheets of dielectric material with predefined circuit patterns; and
   laminating the graphite sheets and the metal-clad sheets of dielectric material, together with unclad sheets of a dielectric material, to form a composite printed circuit board;
   wherein the graphite sheets are positioned in a symmetrical manner with respect to the thickness of the circuit board and selected in number to provide a multilayer circuit board having a desired coefficient of thermal expansion;
   and wherein some of the patterned metal-clad sheets of dielectric material form microstrip transmission lines for electrically connecting very high frequency electronic components mounted on the board, the patterned conductive metal layers forming the line conductors of the microstrip transmission lines and the unpatterned conductive metal layers forming the ground planes.

13. A method for fabricating a multilayer printed circuit board as set forth in claim 12, wherein some of the patterned metal-clad sheets of dielectric material are positioned with some of the metal-clad graphite sheets and unclad sheets of dielectric material to form strip transmission lines, the patterned conductive metal layers forming the line conductors of the strip transmission lines and the unpatterned conductive metal layers forming the ground planes.

14. A method for fabricating a multilayer printed circuit board as set forth in claim 13, wherein the step of forming includes the step of:
   impregnating a woven graphite cloth with a bonding material to form a plurality of solid graphite sheets.

15. A method for fabricating a multilayer printed circuit board as set forth in claim 13, wherein the step of forming includes the step of:
   impregnating a layer of unidirectional graphite fibers with a bonding material to form a plurality of solid graphite sheets.

16. A method for fabricating a multilayer printed circuit board as set forth in claim 13, wherein the sheets of dielectric material include a polytetrafluoroethylene (PTFE) material.

17. A method for fabricating a multilayer printed circuit board as set forth in claim 13, wherein the conductive metal layers include copper.

18. A method for fabricating a multilayer printed circuit board as set forth in claim 13, and further including the steps of:
   pre-drilling the graphite sheets, prior to the laminating step, at predetermined locations for via holes and mounting screw holes;
   filling the pre-drilled with a resin; and
   drilling the laminated board at the predetermined hole locations, using a smaller diameter drill, to leave an annular sheath of insulating resin around each hole through the graphite sheets.

* * * * *